United States Patent
Perroni et al.

(10) Patent No.: US 11,380,393 B2
(45) Date of Patent: Jul. 5, 2022

(54) MEMORY DEVICE AND METHOD FOR COUPLING A MAIN BITLINE TO TWO POINTS OF A LOCAL BITLINE

(71) Applicant: STMicroelectronics International N.V., Geneva (CH)

(72) Inventors: Maurizio Francesco Perroni, Messina (IT); Fabio Enrico Carlo Disegni, Spino d'adda (IT); Massimo Caruso, Messina (IT); Cesare Torti, Pavia (IT)

(73) Assignee: STMICROELECTRONICS INTERNATIONAL N.V., Geneva (CH)

( * ) Notice: Subject to any disclaimer, the term of this patent is extended or adjusted under 35 U.S.C. 154(b) by 0 days.

(21) Appl. No.: 17/129,016

(22) Filed: Dec. 21, 2020

(65) Prior Publication Data

US 2021/0193221 A1    Jun. 24, 2021

(30) Foreign Application Priority Data

Dec. 23, 2019  (IT) ........................ 102019000025411

(51) Int. Cl.
  *G11C 11/00*   (2006.01)
  *G11C 13/00*   (2006.01)

(52) U.S. Cl.
  CPC ...... *G11C 13/0026* (2013.01); *G11C 13/0004* (2013.01); *G11C 2213/79* (2013.01)

(58) Field of Classification Search
  CPC ............ G11C 13/0026; G11C 13/0004; G11C 2213/79; G11C 7/12; G11C 7/18; G11C 8/10; G11C 5/02; G11C 11/407

USPC .......................................... 365/163
  See application file for complete search history.

(56) References Cited

U.S. PATENT DOCUMENTS

| | | | | |
|---|---|---|---|---|
| 6,351,413 | B1* | 2/2002 | Micheloni | G11C 5/025 365/185.11 |
| 7,126,853 | B2* | 10/2006 | Kim | G11C 7/18 365/185.11 |
| 7,808,817 | B2* | 10/2010 | Cho | G11C 13/0026 365/163 |
| 8,040,720 | B2* | 10/2011 | Ha | G11C 5/146 365/163 |
| 2007/0133268 | A1 | 6/2007 | Choi et al. | |
| 2009/0040819 | A1 | 2/2009 | Cho et al. | |
| 2009/0285015 | A1 | 11/2009 | Ha et al. | |
| 2016/0141334 | A1 | 5/2016 | Takaki et al. | |
| 2018/0240519 | A1* | 8/2018 | Manfre | G11C 8/16 |

FOREIGN PATENT DOCUMENTS

EP         1708202 A2    10/2006

* cited by examiner

*Primary Examiner* — Tha-O H Bui
(74) *Attorney, Agent, or Firm* — Slater Matsil, LLP

(57) ABSTRACT

An embodiment non-volatile memory device includes an array of memory cells arranged in rows and columns; a plurality of local bitlines; and a plurality of main bitlines, each main bitline being coupleable to a corresponding subset of local bitlines. The memory cells of each column are coupled to a corresponding local bitline. The memory device further includes a column decoder, which can be controlled electronically so as to couple each main bitline to a selected local bitline of the corresponding subset of local bitlines. The column decoder couples each main bitline to two different points of the corresponding selected local bitline.

20 Claims, 7 Drawing Sheets

MEMORY DEVICE AND METHOD FOR COUPLING A MAIN BITLINE TO TWO POINTS OF A LOCAL BITLINE

CROSS-REFERENCE TO RELATED APPLICATIONS

This application claims the benefit of Italian Application No. 102019000025411, filed on Dec. 23, 2019, which application is hereby incorporated herein by reference.

TECHNICAL FIELD

Embodiments generally relate to a non-volatile memory device and method of operating thereof, the memory device including a column decoder that reduces the voltage drop along the selected local bitlines.

BACKGROUND

Phase-change memory (PCM) generally exploits the characteristics of materials having the property of switching between phases with different electrical characteristics in order to store data.

SUMMARY

An embodiment non-volatile memory device comprises an array of memory cells arranged in rows and columns; a plurality of local bitlines; and a plurality of main bitlines, each main bitline being coupleable to a corresponding subset of local bitlines. The memory cells of each column are coupled to a corresponding local bitline. The memory device further comprises a column decoder, which can be controlled electronically so as to couple each main bitline to a selected local bitline of the corresponding subset of local bitlines. The column decoder is configured to couple each main bitline to two different points of the corresponding selected local bitline.

In a further embodiment according to the preceding embodiment, each local bitline comprises a first point and a second point, to which the memory cells of the corresponding column that belong to the first and last rows are respectively coupled; wherein the column decoder is configured to couple each main bitline to the first and second points of the corresponding selected local bitline.

In a further embodiment according to one of the preceding embodiments, the column decoder comprises a first subcircuit and a second subcircuit; wherein, for each main bitline, the first subcircuit comprises, for each local bitline of the corresponding subset of local bitlines, a corresponding top switch, which is set between the main bitline and the first point of the local bitline; and wherein, for each main bitline, the second subcircuit comprises, for each local bitline of the corresponding subset of local bitlines, a corresponding bottom switch, which is set between the main bitline, and the second point of the local bitline.

In a further embodiment according to one of the preceding embodiments, the top switches and the bottom switches are metal-oxide-semiconductor field-effect transistors (MOSFETs).

In a further embodiment according to one of the preceding embodiments, the first and second subcircuits are the same as one another and are arranged in a symmetrical way with respect to the array of memory cells.

In a further embodiment according to one of the preceding embodiments, each memory cell comprises a respective selector and a respective phase-change element, which is configured to have a first value of resistance or a second value of resistance, which can be associated to corresponding logic data.

In a further embodiment according to one of the preceding embodiments, the selector is formed by a bipolar transistor.

An embodiment electronic apparatus comprises a memory device according to any one of the preceding embodiments; a controller; and a bus configured to electrically couple the controller and the memory device.

BRIEF DESCRIPTION OF THE DRAWINGS

For a better understanding of the present invention, preferred embodiments thereof will now be described, purely by way of non-limiting example, with reference to the attached drawings, wherein.

DETAILED DESCRIPTION OF ILLUSTRATIVE EMBODIMENTS

Embodiments of the present invention generally provide a column decoder that will overcome at least in part the drawbacks of the prior art.

According to embodiments of the present invention, a memory device and method are provided as defined in the annexed claims.

Figure 1:
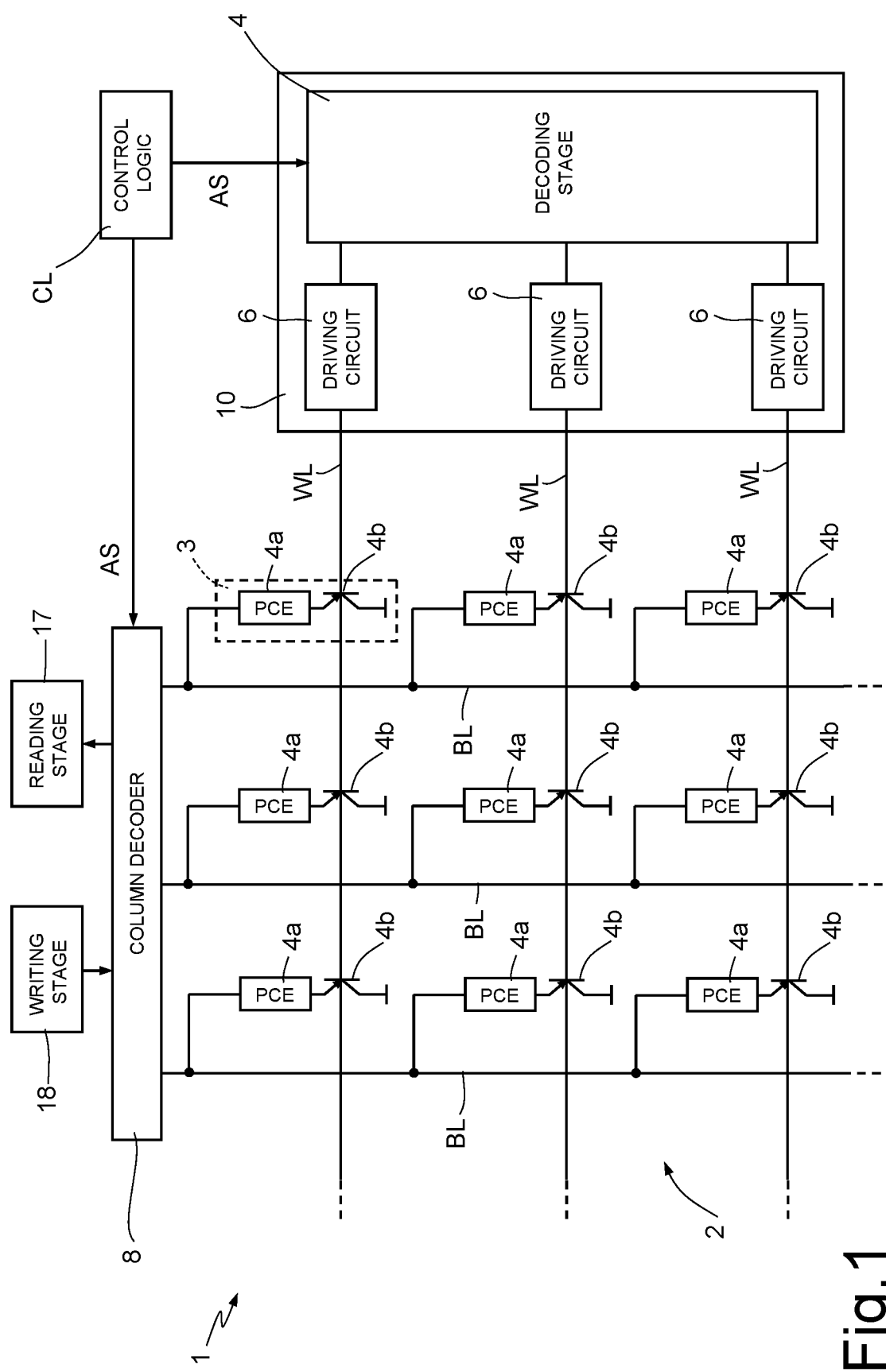
FIG. 1 shows a block diagram of a memory device.

FIG. 1 shows, by way of example, a memory device 1 of a known type, which exploits the characteristics of materials having the property of switching between phases with different electrical characteristics in order to store data. In other words, the memory device 1 is a so-called phase-change memory (PCM).

The memory device 1 comprises a memory array 2 formed by a plurality of memory cells 3, arranged in rows, or wordlines, and columns, or bitlines. Purely by way of example, illustrated in FIG. 1 are three wordlines, denoted by WL, and three bitlines, denoted by BL, which enable addressing of nine memory cells 3.

Each memory cell 3 is formed by a storage element 4a, also known as phase-change element (PCE), and by a selector element 4b, which are connected in series between a respective bitline BL and a terminal at a reference potential (for example, ground).

The storage element 4a includes an element made of phase-change material (for example, a chalcogenide, such as GST) and is consequently able to store data in the form of levels of resistance associated to the different phases assumed by the material itself.

The selector element 4b functions as access device and is formed by a bipolar transistor (BJT) of a PNP type, the emitter terminal of which is connected to a first terminal of the storage element 4a, while the base terminal is connected to a corresponding wordline WL. The collector terminal of the bipolar transistor is connected to ground. In this regard, each wordline WL is connected to all the base terminals of the bipolar transistors aligned along the corresponding row. Moreover, each bitline BL is connected to the second terminal of the storage elements 4a aligned along the corresponding column.

In practice, given a memory cell 3, the second terminal of the storage element 4a and the base terminal of the bipolar transistor 4b form, respectively, a bitline terminal and a wordline terminal of the memory cell 3.

The memory device 1 further comprises a column decoder 8 and a row decoder 10, which enable selection of the memory cells 3 on the basis of address signals received at input (designated as a whole by AS). The address signals AS can be generated by a control logic CL, which moreover governs the column decoder 8 and the row decoder 10 so as to enable reading and writing (also known as programming) of the memory cells 3 addressed by the address signals AS. The control logic CL supplies to the column decoder 8 and to the row decoder 10 also control signals in order to govern the reading/writing operations.

The column decoder 8 and the row decoder 10 enable biasing, and hence selection, of the wordlines WL and bitlines BL each time selected so as to select the memory cells 3 connected to them; in this way, reading and writing of the memory cells 3 are enabled.

In greater detail, the row decoder 10 is designed to select, on the basis of the address signals AS, a corresponding wordline WL. The other wordlines WL are de-selected. For this purpose, the row decoder 10 comprises a decoding stage 4 and a plurality of driving circuits 6.

The decoding stage 4 receives the address signals AS and governs the driving circuits 6 according to the address signals AS. Each driving circuit 6 hence has an input, which is connected to the decoding stage 4. Each driving circuit 6 moreover has an output, which is connected to a corresponding wordline WL.

Each driving circuit 6 biases, and hence controls, the base terminals of the bipolar transistors 4b connected to the corresponding wordline WL so as to select/de-select the wordline WL according to the address signals AS.

As regards the column decoder 8, this selects, according to the address signals AS, one or more bitlines BL. In practice, the column decoder 8 co-operates with the row decoder 10 in such a way that, during the steps of reading or writing of any memory cell 3 selected, a reading current or a writing current, respectively, flows through the storage element 4a of the memory cell 3.

In particular, the column decoder 8 is configured for implementing within it two distinct paths towards the bitlines BL of the memory array 2 each time selected: a reading path, which electrically connects each bitline BL selected to a reading stage 17, during the reading step; and a writing path, which electrically connects each bitline BL selected to a writing stage 18, during the programming step.

The column decoder 8 comprises, for each reading and writing path, appropriate selection elements (in particular, transistors), which are connected so as to implement a hierarchical decoding of the addresses in order to select the memory cells 3.

Figure 2:
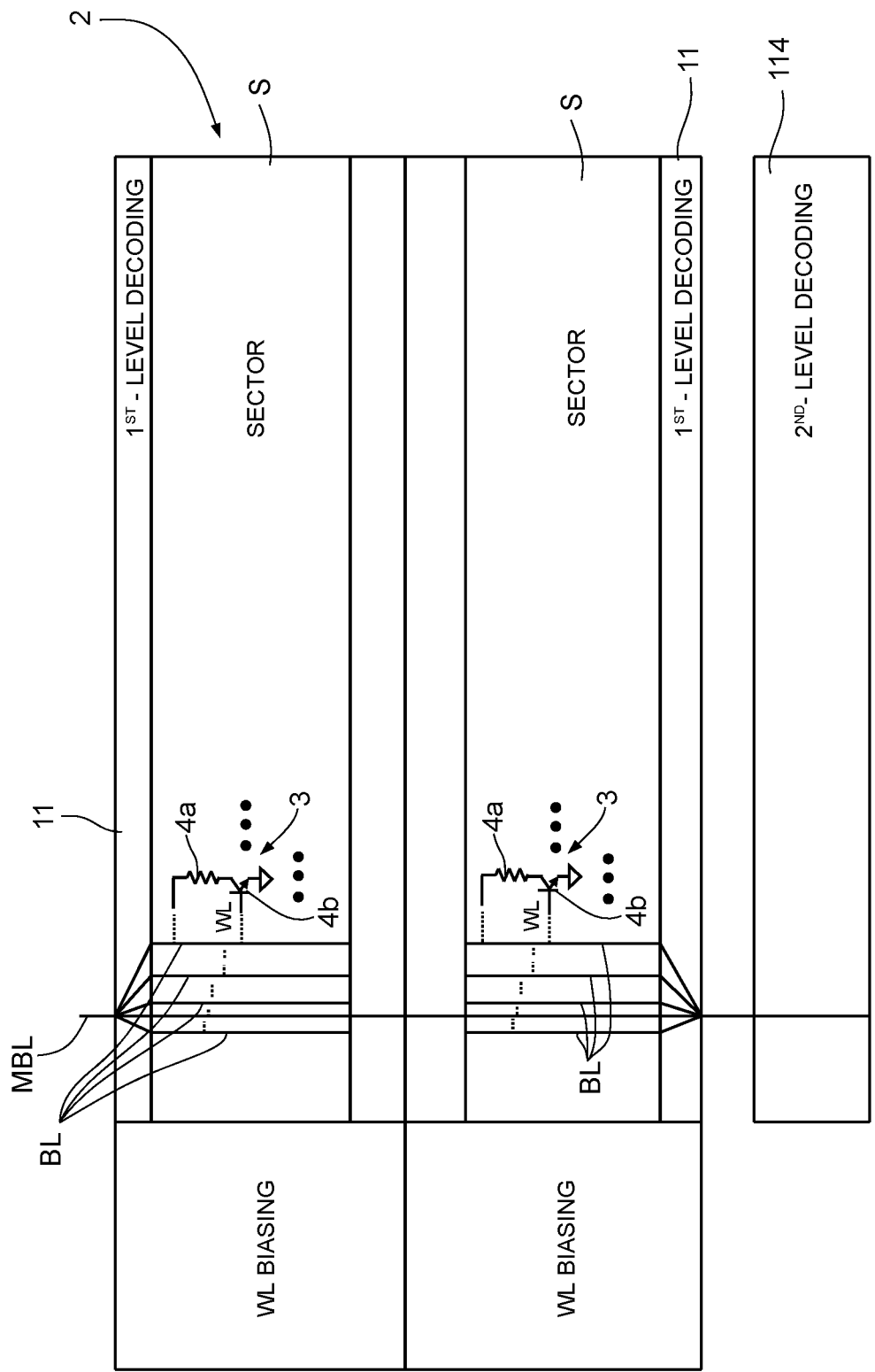
FIGS. 2 and 3 show block diagrams of portions of the memory device illustrated in FIG. 1.

As illustrated schematically in FIG. 2, the memory array 2 is usually organized in a plurality of sectors S, each of which comprises a plurality of memory cells 3. Each sector S includes a plurality of respective wordlines WL and a plurality of respective local bitlines, which are designated once again by BL and are distinct from those of the other sectors. In each sector S, the local bitlines BL are connected to the memory cells 3 of one and the same sector S. In addition, for each set formed by an integer number k (for example, thirty-two) of local bitlines BL, a corresponding main bitline MBL is provided. The main bitlines MBL enable, when selected at a higher hierarchical level, subsequent selection, at a lower hierarchical level, of one or more of the respective local bitlines BL and of the corresponding memory cells 3. In addition, different sectors S are traversed by different wordlines WL.

In general, use of the adjective "local", when referring to a bitline or to a wordline, underscores the fact that the bitline or wordline in question belongs to a given sector.

The main bitlines MBL traverse a certain number of sectors S and can be selected in groups at a hierarchical decoding level even higher than the one associated to selection of the main bitlines MBL.

In greater detail, the column decoder 8 comprises: for each sector S, at least one respective first-level decoding circuit (designated by 11 in FIG. 2 and also known as "local column decoder"), which enables connection of the local bitlines BL to the respective main bitlines MBL both during the writing operations and during the reading operations; for each group of sectors S (constituted, in the example of FIG. 2, by two sectors), a respective second-level decoding circuit (designated by 114 and also known as "global column decoder"), which enables selection of the main bitlines MBL both during the writing operations and during the reading operations.

This having been said, in what follows reference is made, for brevity, to just the reading step, except where otherwise specified.

Figure 3:
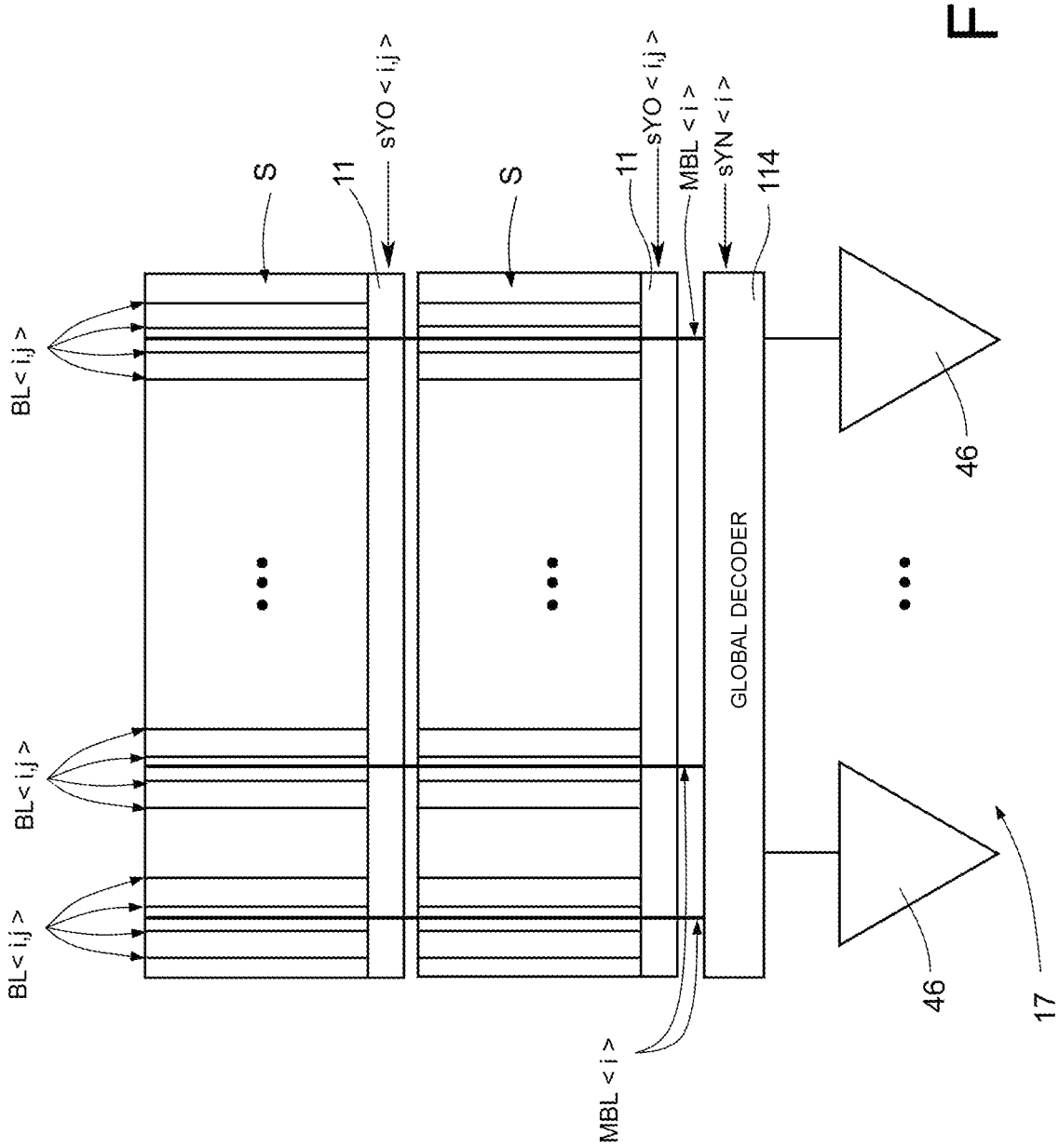

The control logic CL sends to the second-level decoding circuit 114 main column-decoding signals sYN<i>, which are visible in FIG. 3 and form part of the aforementioned address signals AS and on the basis of which the second-level decoding circuit 114 activates an electrical path between a main bitline (here designated by MBL<i>) selected and a sense amplifier 46 of the reading stage 17, via activation of a respective main selection switch (not illustrated). In this connection, the reading stage 17 comprises a plurality of sense amplifiers, even though reference is here made to just the sense amplifier 46.

As mentioned previously, FIG. 3 moreover shows how, given each sector S, each main bitline MBL<i> is associated, i.e., electrically coupleable, to a corresponding set of local bitlines, denoted by BL<i,j>. It should be noted that, for simplicity, in FIG. 3 the main bitlines are all denoted by MBL<i>, even though in actual fact the value of the index "i" varies; likewise, the local bitlines are all denoted by BL<i,j>, even though in actual fact the index "i" depends upon the index of the main bitline to which the local bitline can be coupled, and the index "j" ranges between 0 and k−1, for each value of the index "i".

Furthermore, given a sector S, the corresponding first-level decoding circuit ii is able to address each memory cell 3 coupled to a local bitline BL<i,j> of the sector S thanks to the presence of switches, which are driven by respective local column-decoding signals sYO<i,j>, which are generated by the control logic CL and also form part of the aforementioned address signals AS. It should be noted that, for simplicity, in FIG. 3 the two groups of local column-decoding signals with which the two first-level decoding circuits 11 are supplied for the two sectors S illustrated herein are both denoted by sYO<i,j>, even though in actual fact they are different, since the control logic CL does not simultaneously select local bitlines belonging to different sectors.

Figure 4A:
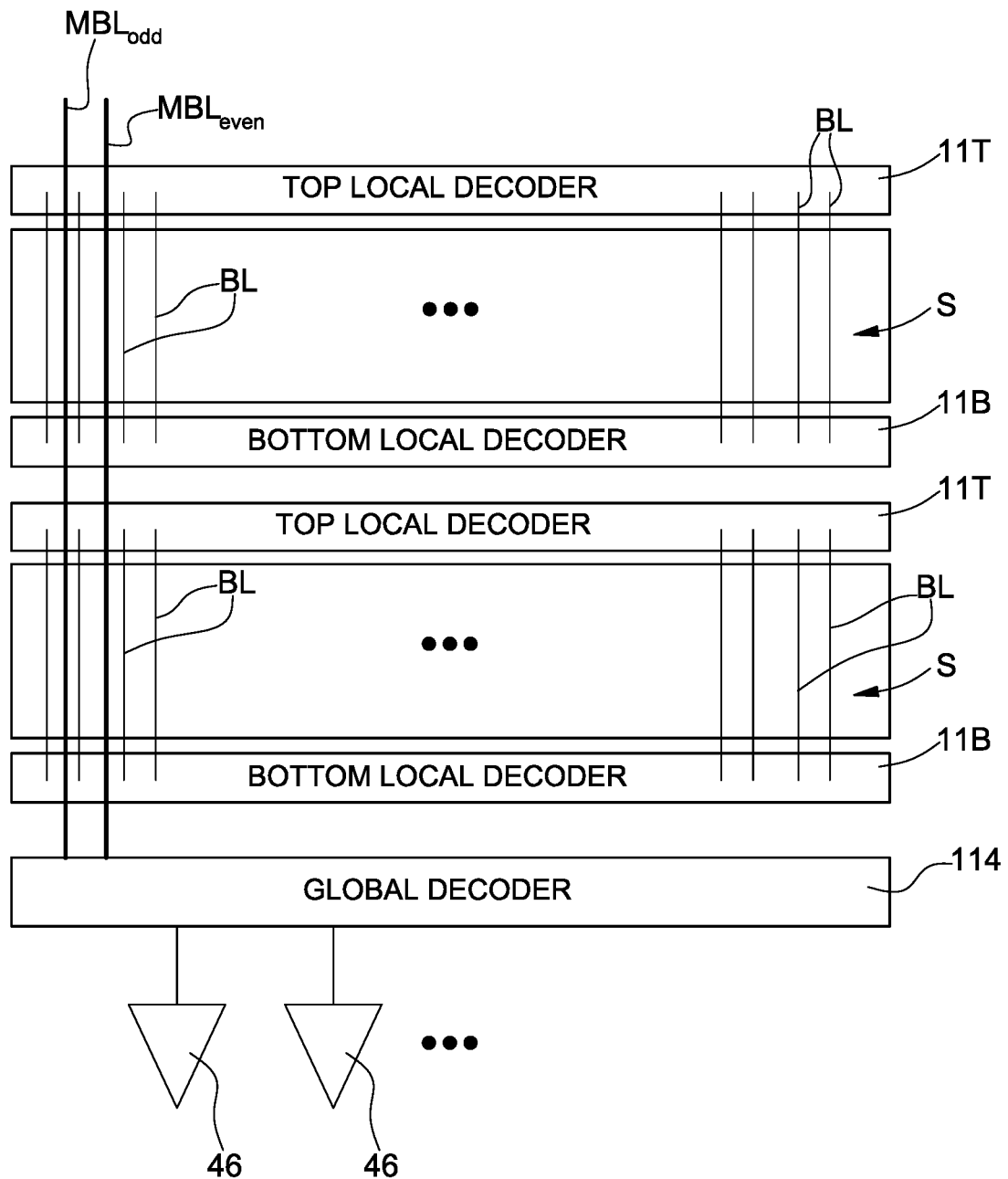
FIG. 4A shows a block diagram of a further memory device.
Figure 4B:
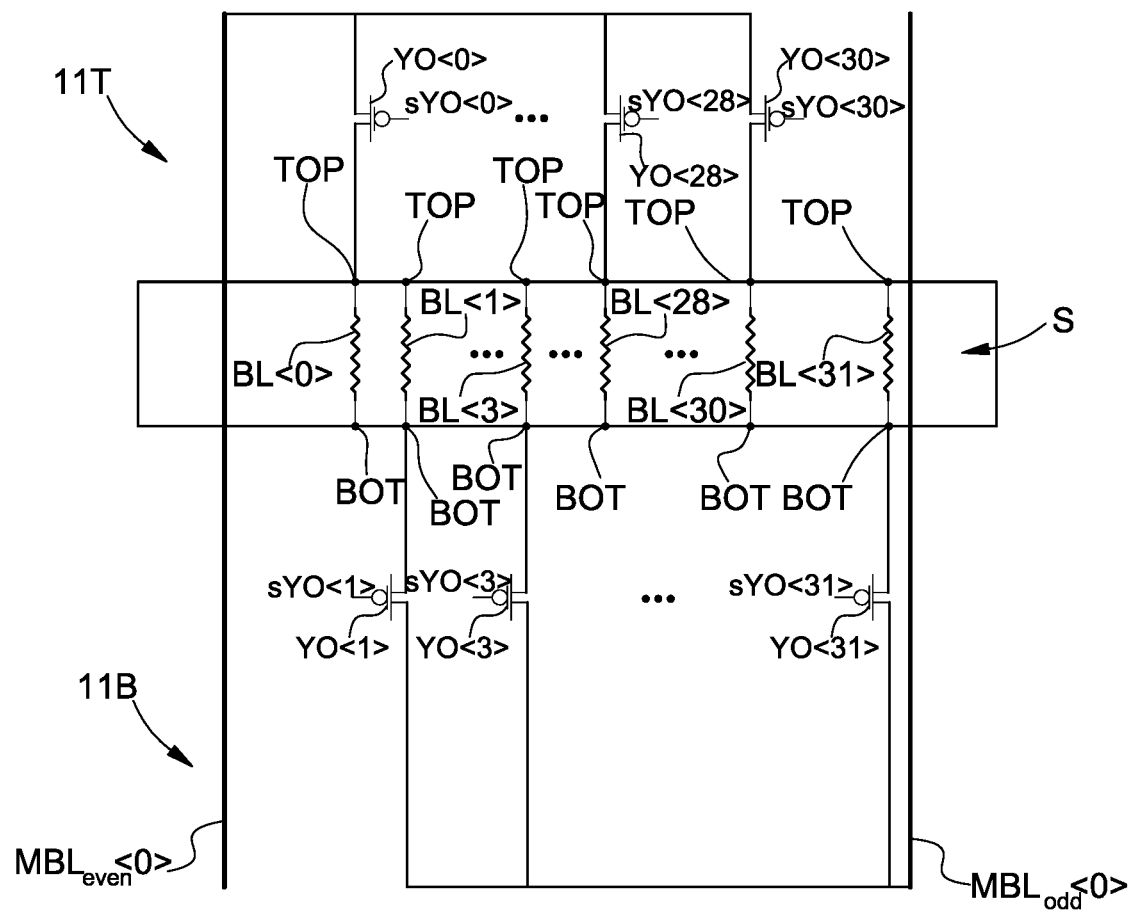
FIG. 4B shows a block diagram of a portion of the memory device illustrated in FIG. 4A.

As illustrated in greater detail in FIG. 4A (where for simplicity the memory cells 3 are not represented) and in FIG. 4B, memory devices are known in which the first-level decoding circuit ii of each sector S is divided into a top local subcircuit 11T and a bottom local subcircuit 11B. In addition, as may be seen in FIG. 4B, the main bitlines are subdivided into even main bitlines $MBL_{even}$, and an odd main bitlines $MBL_{odd}$. In addition, in each sector S, each even main bitline $MBL_{even}$ can be coupled, in an electronically controllable way, to a corresponding subset of, for example, sixteen local bitlines BL<2U>, with U=0, 1, 2, . . . , 15, referred to in what follows also as even local bitlines BL<2U>; likewise, in each sector S, each odd main bitline $MBL_{odd}$ can be coupled, in an electronically controllable way, to a corresponding subset of sixteen local bitlines BL<1+2W>, with W=0, 1, 2, . . . , 15, referred to in what follows also as odd local bitlines BL<1+2W>. The even local bitlines BL<2U> and odd local bitlines BL<1+2W> are arranged in sequence, alternating with one another, so as to form a set of thirty-two adjacent local bitlines.

The top local subcircuit 11T controls coupling between each even main bitline $MBL_{even}$ and the corresponding subset of even local bitlines BL<2U>. In addition, the bottom local subcircuit 11B controls coupling between each odd main bitline $MBL_{odd}$ and the corresponding subset of odd local bitlines BL<1+2W>. The top local subcircuit 11T is set above the sector S, whereas the bottom local subcircuit 11B is set below the sector S.

In greater detail, with reference, for example, to the even local bitline BL<0>, in what follows designated by TOP and BOT are two points of the even local bitline BL<0> that delimit the portion of even local bitline BL<0> that traverses the sector S. Consequently, assuming, for example, that the sector S includes five hundred and twelve wordlines WL, and hence assuming that the even local bitline BL<0> is coupled to five hundred and twelve memory cells 3, which form the corresponding column, and if the memory cells 3, of the memory cells 3, that belong respectively to the first and last rows of the sector S are referred to as first and last memory cells 3 (which are hence memory cells 3 that occupy the positions one and five hundred and twelve, respectively, along the column), it is found that the storage elements 4a of the first and last memory cells 3 are connected, respectively, to the point TOP and to the point BOT. The same considerations apply to the even local bitlines other than the even local bitline BL<0>, as well as to the odd local bitlines BL<1>-BL<31>.

This having been said, the top local subcircuit 11T comprises, for each even main bitline $MBL_{even}$ (one of which is illustrated in FIG. 4B and is designated by $MBL_{even}$<0>), sixteen transistors (P-channel enhancement MOSFETs), which are designated, respectively, by YO<0>, YO<2>, . . . , YO<30> and are referred to in what follows as top addressing transistors. Likewise, the bottom local subcircuit 11B comprises, for each odd main bitline $MBL_{odd}$ (one of which is illustrated in FIG. 4B, designated by $MBL_{odd}$<0>), another sixteen transistors (P-channel enhancement MOSFETs), which are designated, respectively, by YO<1>, YO<3>, . . . , YO<31> and are referred to in what follows bottom addressing transistors.

Each of the aforementioned top addressing transistors YO<0>-YO<30> is set between the even main bitline $MBL_{even}$<0> and a corresponding even local bitline BL<0>-BL<30>. For instance, with reference to the top addressing transistor YO<0>, its source terminal ("source") is connected to the even main bitline $MBL_{even}$<0>, while its drain terminal ("drain") is connected to the even local bitline BL<0>, and in particular to the point TOP of the even local bitline BL<0>. The memory cell 3 that occupies the first position of the column that corresponds to the even local bitline BL<0> is hence the memory cell closest to the top addressing transistor YO<0>. The same considerations apply to the other top addressing transistors YO<2>-YO<30> and the other even local bitlines BL<2>-BL<30>.

Each of the aforementioned bottom addressing transistors YO<1>-YO<31> is set between the odd main bitline $MBL_{odd}$<0> and a corresponding odd local bitline BL<1>-BL<31>. For instance, with reference to the bottom addressing transistor YO<1>, its source terminal is connected to the odd main bitline $MBL_{odd}$<0>, while its drain terminal is connected to the odd local bitline BL<1>, and in particular to the point BOT of the odd local bitline BL<1>. The memory cell 3 that occupies the last position of the column that corresponds to the odd local bitline BL<1> is hence the memory cell closest to the bottom addressing transistor YO<1>. The same considerations apply to the other bottom addressing transistors YO<1>-YO<31> and the other odd local bitlines $BL<_3>$-BL<31>.

Each top addressing transistor YO<0>-YO<30> receives on its own gate terminal a corresponding local column-decoding signal, denoted by sYO<0>-sYO<30>, respectively. Likewise, each bottom addressing transistor YO<1>-YO<31> receives, on its own gate terminal, a corresponding local column-decoding signal, denoted by sYO<1>-sYO<31>, respectively.

The control logic CL generates the addressing signals sYO<0>-sYO<30> in such a way that only one of the top addressing transistors YO<0>-YO<30> is above threshold, and hence couple the respective even local bitline BL<2U> to the even main bitline $MBL_{even}$<0>. The other top addressing transistors YO<0>-YO<30> are inhibited and, hence, the corresponding even local bitlines BL<2U> are decoupled from the even main bitline $MBL_{even}$<0>. Likewise, the control logic CL generates the addressing signals sY1<0>-sYO<31> in such a way that only one of the bottom addressing transistors YO<1>-YO<31> is above threshold, and hence couples the respective odd local bitline BL<1+2W> to the odd main bitline $MBL_{odd}$<0>; the other bottom addressing transistors YO<1>-YO<31> are inhibited and, hence, the corresponding odd local bitlines BL<1+2W> are decoupled from the odd main bitline $MBL_{odd}$<0>.

All this having been said, the present applicant has noted how, with reference, for example, to any even local bitline BL<2U>, when this is selected, and for instance in the reading step, a voltage drop occurs along the bitline itself (the mildly resistive behaviour of which is represented, in FIG. 4B, by a corresponding resistor), the voltage drop being to the flow of a reading current, which comes from the even main bitline $MBL_{even}$<0>. Consequently, the memory cells 3 coupled to the even local bitline BL<2U> selected do not all see one and the same voltage, with consequent onset of undesirable asymmetries and irregularities. In particular, of the memory cells 3 coupled to the even local bitline BL<2U> selected, the memory cell 3 that undergoes the maximum voltage drop, with respect to the voltage present on the even main bitline $MBL_{even}$<0>, is the one located in the last row, i.e., the one connected to the point BOT of the even local bitline BL<2U> selected. Similar considerations apply to the odd local bitlines BL<1+2W>, in which case, however, of the memory cells 3 coupled to the odd local bitline BL<1+2W> selected, the memory cell 3 that undergoes the maximum voltage drop, with respect to the voltage present on the odd main bitline $MBL_{odd}$<0>, is the one connected to the point TOP of the odd local bitline BL<1+2W> selected. Irrespective of whether the local bitline is even or odd, the maximum reduction in voltage (with respect to the voltage of the main bitline MBL) that a memory cell 3 selected undergoes is equal to $\Delta V = R \cdot I_{cell}$, where R is the resistance of the local bitline, between the respective point TOP and the respective point BOT, whereas $I_{cell}$ is the current that, coming from the reading stage 17, flows in the corresponding main bitline MBL and then traverses the entire local bitline.

The present applicant has noted how it is desirable, given selection of any local bitline, for the memory cells coupled thereto, and in particular the corresponding bitline terminals to be as much as possible subject to one and the same voltage, as close as possible to the voltage present on the corresponding main bitline selected. In this way, a better uniformity of behaviour of the memory device is guaranteed, irrespective of the memory area that is each time selected for reading/writing.

Figure 5:
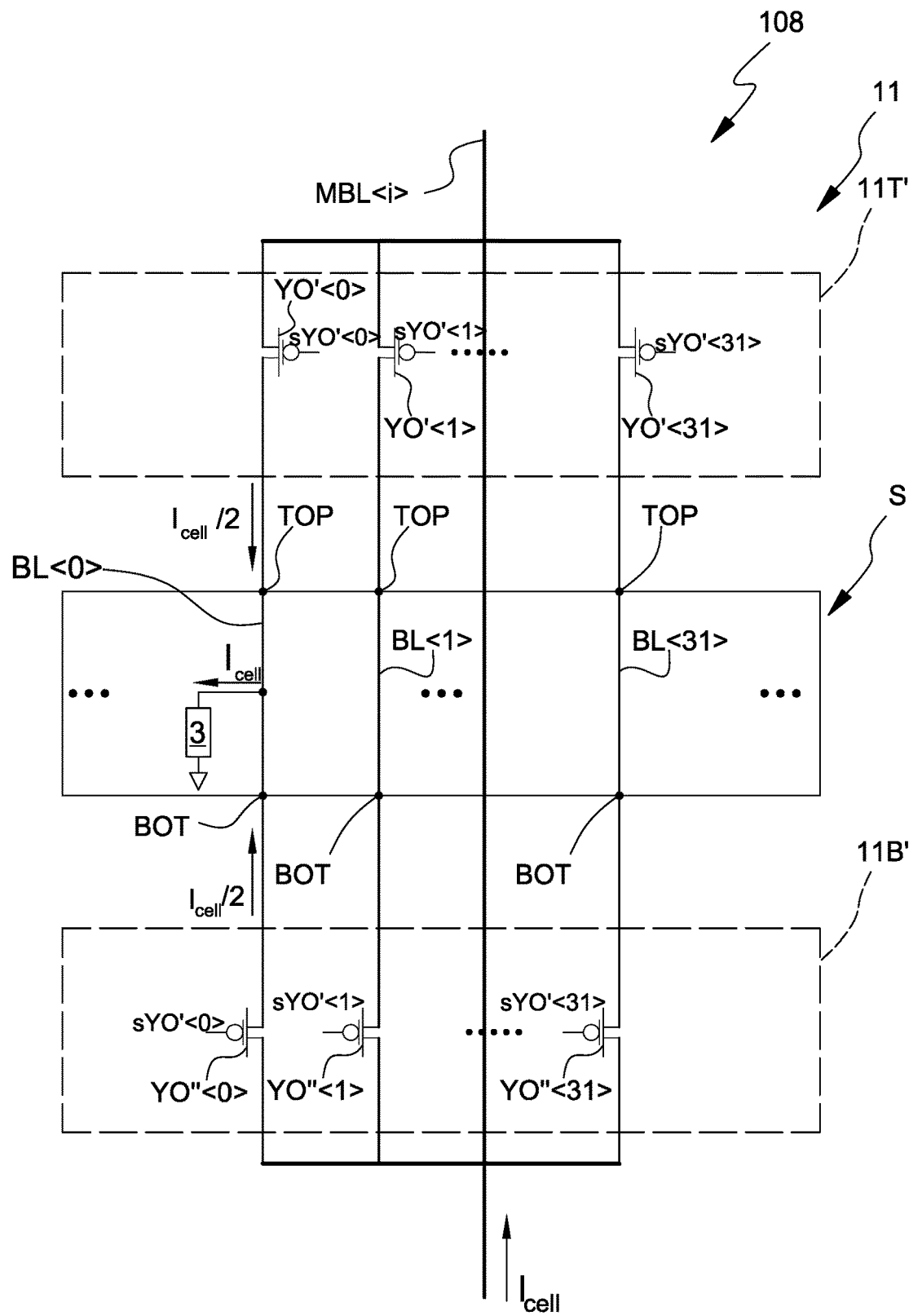
FIG. 5 shows a block diagram of a portion of the present memory device.

FIG. 5 shows a column decoder 108, which is now described as regards the differences with respect to what has been illustrated in FIGS. 4A-4B. Elements already illustrated in FIGS. 4A-4B are designated by the same references, except where otherwise specified.

In detail, in the column decoder 108 each main bitline (designated by MBL) is connected to a corresponding set formed by k (for example, thirty-two) local bitlines BL, arranged in succession; in other words, each main bitline MBL is connected both to even local bitlines and to odd local bitlines. Purely by way of example, in FIG. 5 a generic i-th main bitline MBL<i> is shown.

In addition, the top local subcircuit (here designated by 11T') comprises, for each main bitline MBL, k top addressing transistors, which are once again P-channel enhancement MOSFETs and are denoted, respectively, with YO'<0>, YO'<1>, . . . , YO'<31>. The drain terminal of the k-th top addressing transistor YO'<k> is connected to the point TOP of the k-th local bitline BL<k>; moreover, the gate terminal of the k-th top addressing transistor YO'<k> receives the k-th local column-decoding signal, denoted by sYO'<k>. Moreover, the source terminals of all thirty-two top addressing transistors YO'<0>-YO'<31> are connected to the corresponding main bitline MBL.

The bottom local subcircuit (here designated by 11B') is identical to the top local subcircuit 11T'. In addition, the bottom local subcircuit 11B' and the top local subcircuit 11T' are arranged in a symmetrical way with respect to the sector S.

In detail, the bottom local subcircuit 11B' comprises, for each main bitline MBL, k bottom addressing transistors (P-channel enhancement MOSFETs), which are denoted, respectively, by YO"<0>, YO"<1>, . . . , YO"<31>. The drain terminal of the k-th bottom addressing transistor YO"<k> is connected to the point BOT of the k-th local bitline BL<k>. In addition, the gate terminal of the k-th bottom addressing transistor YO"<k> receives the k-th local column-decoding signal sYO'<k>. Moreover, the source terminals of all thirty-two bottom addressing transistors YO"<0>-YO"<31> are connected to the corresponding main bitline MBL.

In practice, the k-th local bitline BL<k> is connected, to its two ends, to the drain terminals of the k-th top addressing transistor YO'<k> and of the k-th bottom addressing transistor YO"<k>, which are both governed by the k-th local column-decoding signal sYO'<k> and hence operate in one and the same operating condition (ON/OFF).

In use, when the control logic CL selects a memory cell 3 coupled to the k-th local bitline BL<k>, the k-th local column-decoding signal sYO'<k> assumes a high logic value in such a way that the k-th top addressing transistor YO'<k> and the k-th bottom addressing transistor YO"<k> are in conduction mode. Both the point TOP and the point BOT of the k-th local bitline BL<k> are hence connected to the main bitline MBL, to which, in a way in itself known, voltage is applied, in the reading step, by a sense amplifier 46 of the reading stage 17. Consequently, if we denote again by $I_{cell}$ the current that flows in the main bitline MBL, coming from the reading stage 17, it divides into two currents $I_{cell}/2$, which, after traversing, respectively, the k-th top addressing transistor YO'<k> and the k-th bottom addressing transistor YO"<k>, are injected, respectively, at the point TOP and at the point BOT of the k-th local bitline BL<k>. For instance, in FIG. 5 it has been assumed that a memory cell 3 coupled to the local bitline BL<0> has been selected.

In this way, it is found that, of the memory cells 3 coupled to the local bitline BL selected, the memory cell 3 that undergoes the maximum voltage drop with respect to the voltage present on the main bitline MBL is the memory cell 3 coupled to the row set half way through the sector S, i.e., assuming, for example, that each sector S includes five hundred and twelve rows, the two hundredth and fiftieth row. However, when the memory cell 3 is selected, it couples to a point of the corresponding local bitline BL intermediate between the corresponding points TOP and BOT, the voltage of which is reduced, as compared to the voltage present on the main bitline MBL, by an amount $\Delta V = (¼) \cdot R \cdot I_{cell}$, where R is once again the resistance of the local bitline BL between the point TOP and the point BOT. In other words, the maximum reduction in voltage is reduced to one quarter as compared to the prior art, with evident benefits in terms of uniformity of the behaviour of the memory device, as the position of the memory cells that are each time selected varies. The above advantages may be appreciated both in the reading step, to which reference has been made previously, and in the writing step, where the main bitlines MBL are connected by the second-level decoding circuit 114 to the writing stage 18, and in particular to so-called program load circuits (not shown), instead of to the sense amplifiers 46 of the reading stage 17.

In addition, the present column decoder enables reduction of the maximum voltage to be applied to the main bitlines during the reading and writing operations, with consequent reduction in the consumption levels and in the electrical stress on the transistors used in decoding.

Figure 6:
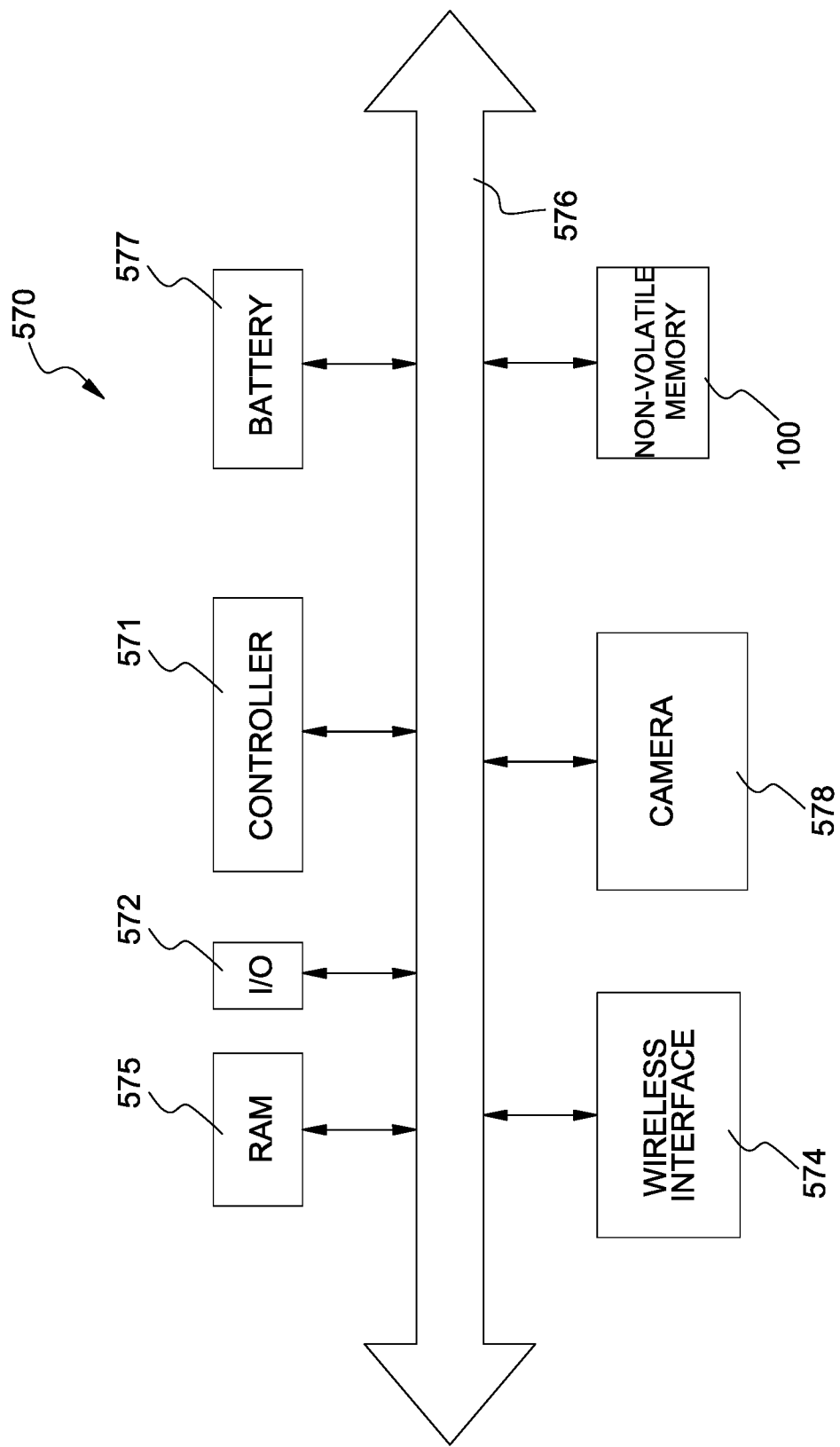
FIG. 6 shows a block diagram of an electronic apparatus that incorporates the present memory device.

FIG. 6 shows an example of application of a memory device 100 that includes the column decoder 108. In particular, FIG. 6 illustrates a portion of an electronic apparatus 570, which may, for example, be: a PDA (personal digital assistant); a portable or fixed computer, possibly with wireless data-transfer capacity; a mobile phone; a digital audio player; a photographic camera or a camcorder; or further devices that are able to process, store, transmit, and receiving information.

In detail, the electronic apparatus 570 comprises: a controller 571 (for example, provided with a microprocessor, a DSP, or a microcontroller); an input/output device 572 (for example, provided with a keypad and a display), for input and display of the data; the memory device wo; a wireless interface 574, for example an antenna, for transmitting and receiving data through a radiofrequency wireless communication network; and a RAM 575. All the components of the electronic apparatus 570 are coupled through a bus 576. It is possible to use a battery 577 as electrical supply source in the electronic apparatus 570, which may moreover be provided with a photographic or video camera 578. In addition, the controller 571 can control the memory device wo, for example by co-operating with the control logic CL.

Finally, it is clear that modifications and variations may be made to what has been described and illustrated herein, without thereby departing from the scope of the present invention, as defined in the annexed claims.

For instance, the memory cells may be of a type different from what has been described. In particular, the selector element 4b may be of a type different from what has been described; for example, it may be a MOSFET. On the other hand, the selector element 4b may even be absent, as, for example, in the case of a so-called non-volatile memory device of a flash type.

What is claimed is:

1. A non-volatile memory device comprising:
an array of memory cells arranged in rows and columns;
a plurality of local bitlines;
a plurality of main bitlines, wherein each same main bitline is coupleable to a corresponding subset of local bitlines, and wherein the memory cells of each column are coupled to a corresponding local bitline; and
a column decoder, wherein the column decoder is electronically controllable to couple each same main bitline to a selected local bitline of the corresponding subset of local bitlines, and wherein the column decoder is configured to couple each same main bitline to two different points of the corresponding selected local bitline using a same respective select signal.

2. The memory device according to claim 1,
wherein each local bitline comprises a first point and a second point, to which the memory cells of the corresponding column that belong to first and last rows are respectively coupled; and
wherein the column decoder is configured to couple each same main bitline to the first and second points of the corresponding selected local bitline.

3. The memory device according to claim 2,
wherein the column decoder comprises a first subcircuit and a second subcircuit;
wherein, for each same main bitline, the first subcircuit comprises, for each local bitline of the corresponding subset of local bitlines, a corresponding top switch, which is set between the same main bitline and the first point of the local bitline; and
wherein, for each same main bitline, the second subcircuit comprises, for each local bitline of the corresponding subset of local bitlines, a corresponding bottom switch, which is set between the same main bitline and the second point of the local bitline.

4. The memory device according to claim 3, wherein the top switches and the bottom switches are metal-oxide-semiconductor field-effect transistors (MOSFETs).

5. The memory device according to claim 3, wherein the first and second subcircuits are the same as one another and are arranged symmetrically with respect to the array of memory cells.

6. The memory device according to claim 1, wherein each memory cell comprises a respective selector and a respective phase-change element, which is configured to have a first value of resistance or a second value of resistance, which can be associated to corresponding logic data.

7. The memory device according to claim 6, wherein each respective selector comprises a bipolar transistor.

8. An electronic apparatus comprising:
a memory device comprising:
an array of memory cells arranged in rows and columns;
a plurality of local bitlines;
a plurality of main bitlines, wherein each same main bitline is coupleable to a corresponding subset of local bitlines, and wherein the memory cells of each column are coupled to a corresponding local bitline; and
a column decoder, wherein the column decoder is electronically controllable to couple each same main bitline to a selected local bitline of the corresponding subset of local bitlines, and wherein the column decoder is configured to couple each same main bitline to two different points of the corresponding selected local bitline using a same respective select signal;
a controller; and
a bus electrically coupling the controller and the memory device.

9. The electronic apparatus according to claim 8,
wherein each local bitline comprises a first point and a second point, to which the memory cells of the corresponding column that belong to first and last rows are respectively coupled; and
wherein the column decoder is configured to couple each same main bitline to the first and second points of the corresponding selected local bitline.

10. The electronic apparatus according to claim 9,
wherein the column decoder comprises a first subcircuit and a second subcircuit;
wherein, for each same main bitline, the first subcircuit comprises, for each local bitline of the corresponding subset of local bitlines, a corresponding top switch, which is set between the same main bitline and the first point of the local bitline; and
wherein, for each same main bitline, the second subcircuit comprises, for each local bitline of the corresponding subset of local bitlines, a corresponding bottom switch, which is set between the same main bitline and the second point of the local bitline.

11. The electronic apparatus according to claim 10, wherein the top switches and the bottom switches are metal-oxide-semiconductor field-effect transistors (MOSFETs).

12. The electronic apparatus according to claim 10, wherein the first and second subcircuits are the same as one another and are arranged symmetrically with respect to the array of memory cells.

13. The electronic apparatus according to claim 8, wherein each memory cell comprises a respective selector and a respective phase-change element, which is configured to have a first value of resistance or a second value of resistance, which can be associated to corresponding logic data.

14. The electronic apparatus according to claim 13, wherein each respective selector comprises a bipolar transistor.

15. A method of operating a non-volatile memory device comprising an array of memory cells arranged in rows and columns, a plurality of local bitlines, a plurality of main bitlines, and a column decoder, the memory cells of each column being coupled to a corresponding local bitline, and each same main bitline being coupleable to a corresponding subset of local bitlines, the method comprising:

controlling the column decoder to couple a selected same main bitline to a selected local bitline of the corresponding subset of local bitlines; and coupling, by the column decoder, the selected same main bitline to two different points of the corresponding selected local bitline using a same respective select signal.

16. The method according to claim 15, wherein each local bitline comprises a first point and a second point, to which the memory cells of the corresponding column that belong to first and last rows are respectively coupled, and the method further comprises:

coupling, by the column decoder, the selected same main bitline to the first and second points of the corresponding selected local bitline.

17. The method according to claim 16, wherein, for each same main bitline, a first subcircuit of the column decoder comprises, for each local bitline of the corresponding subset of local bitlines, a corresponding top switch between the same main bitline and the first point of the local bitline, and, for each same main bitline, a second subcircuit of the column decoder comprises, for each local bitline of the corresponding subset of local bitlines, a corresponding bottom switch between the same main bitline and the second point of the local bitline, and the method further comprises:

turning on, for the selected local bitline, the corresponding top and bottom switches.

18. The method according to claim 17, wherein the top and bottom switches are metal-oxide-semiconductor field-effect transistors (MOSFETs) controlled by the column decoder.

19. The method according to claim 17, wherein the first and second subcircuits are the same as one another and are symmetrically controlled with respect to the array of memory cells.

20. The method according to claim 15, wherein each memory cell comprises a respective selector and a respective phase-change element, and the method further comprises:

setting, for each memory cell, a first value of resistance or a second value of resistance associated with corresponding logic data.

\* \* \* \* \*